United States Patent [19]
Robinette, Jr. et al.

[11] Patent Number: 5,508,558
[45] Date of Patent: Apr. 16, 1996

[54] HIGH DENSITY, HIGH SPEED, SEMICONDUCTOR INTERCONNECT USING-MULTILAYER FLEXIBLE SUBSTRATE WITH UNSUPPORTED CENTRAL PORTION

[75] Inventors: William C. Robinette, Jr., Los Altos Hills; Chung W. Ho, Monte Sereno, both of Calif.

[73] Assignee: Digital Equipment Corporation, Maynard, Mass.

[21] Appl. No.: 144,842

[22] Filed: Oct. 28, 1993

[51] Int. Cl.$^6$ ........................................... H01L 23/48
[52] U.S. Cl. ..................... 257/700; 257/692; 257/701; 257/778
[58] Field of Search ........................... 257/700, 692, 257/778, 701, 685; 361/764

[56] References Cited

U.S. PATENT DOCUMENTS

| | | | |
|---|---|---|---|
| 4,783,695 | 11/1988 | Eichelberger | 257/700 |
| 4,812,191 | 3/1989 | Ho et al. | 156/236 |
| 4,949,224 | 8/1990 | Yamamura et al. | 361/412 |
| 4,993,958 | 2/1991 | Trobough et al. | 439/91 |
| 5,018,005 | 5/1991 | Lin et al. | 257/692 |
| 5,057,907 | 10/1991 | Ooi et al. | 357/80 |
| 5,065,227 | 11/1991 | Frankeny | 257/778 |
| 5,065,279 | 11/1991 | Lazenby | 361/386 |
| 5,069,628 | 12/1991 | Crumly | 439/67 |
| 5,095,628 | 3/1992 | McKenney et al. | 29/846 |
| 5,099,393 | 3/1992 | Bentlage et al. | 361/413 |
| 5,160,999 | 11/1992 | Opitz | 257/702 |

*Primary Examiner*—William Mintel
*Assistant Examiner*—Roy Potter
*Attorney, Agent, or Firm*—Arthur W. Fisher; Denis G. Maloney; Joanne N. Pappas

[57] ABSTRACT

An interconnect structure formed of a flexible, multilayer dielectric material such as polyimide, having a support ring, connection points on the section inside the support ring for connecting one or more semiconductor chips, and connection points outside the support ring for connecting to a circuit board. Alignment templates are disclosed which align the semiconductor chip with the connection points.

17 Claims, 7 Drawing Sheets

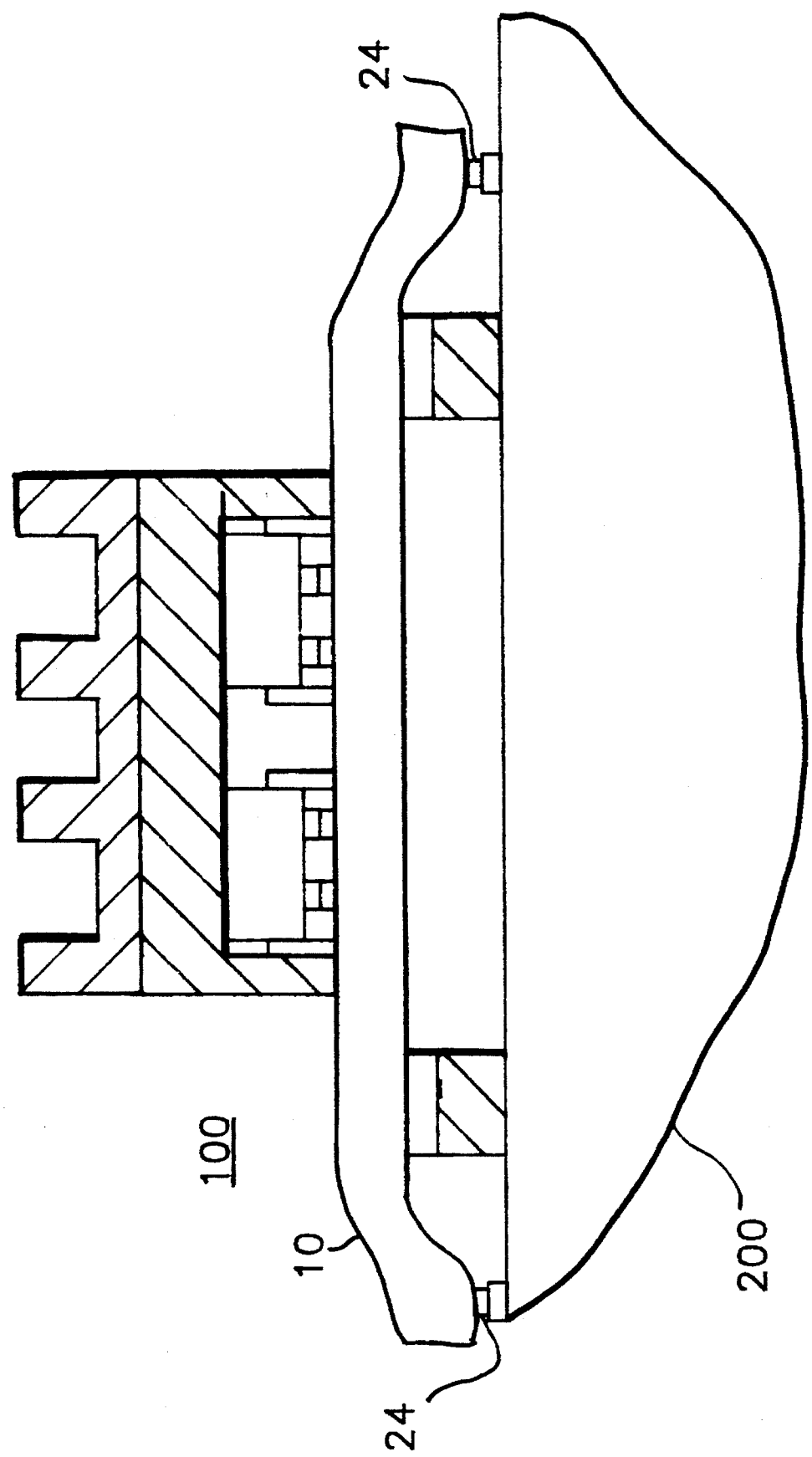

HIGH DENSITY, HIGH SPEED, SEMICONDUCTOR INTERCONNECT USING-MULTILAYER FLEXIBLE SUBSTRATE WITH UNSUPPORTED CENTRAL PORTION

BACKGROUND OF THE INVENTION

This invention relates to structures for interconnecting electronic devices such as semiconductor chips to higher level assemblies, typically circuit boards.

Connecting the devices to higher level assemblies has typically been accomplished by a set of leads, which on one end could be connected to a interconnection point on the periphery of the device, and on the other end could be connected to the higher level assembly. As devices were designed with increasing numbers of interconnection points on the devices, the interconnection points became smaller and closer together, and new methods were needed to provide the connection between the devices and higher level assemblies. One of these methods is known as tape automated bonding (TAB) in which the circuitry is formed on film similar to photographic film, and connected, as in previous methods of interconnection, to interconnection points on the periphery of the device.

Placing interconnection points on the periphery of a device, makes the circuitry in the device more complex. In an effort to simplify the circuitry of the devices, designers developed devices in which the interconnection points were over an entire surface of a device, rather than just at the periphery. In response to such devices, the so-called "Area TAB" technology was developed.

One of the drawbacks of area tab is the difficulty in routing the connection points on the interior of the device to a connection pad on the TAB tape frame. Thus a packaging method which allows connection points over the entire surface of the chip, but which allows the connection points to be conveniently connected to interconnection points on the periphery, is desirable.

A second method for maximizing the performance of electronic devices is to place more than one device in a single package, to form a so-called multi-chip package (MCP). MCPs, however, present a challenge of their own, among them dealing with differences in height and planarity between the devices, and providing interconnection between the devices.

A need, therefore, exists for providing apparatus and methods for providing electrical connection between connection points on the interior of a surface of a semiconductor device and higher level assemblies which provide for differences in height and planarity between devices and which provide interconnection between devices.

SUMMARY OF THE INVENTION

According to the invention, a multilayer flexible substrate is provided. Connection points for electronic devices are provided on the top of the multilayer substrate. Connecting pads on the perimeter of the multilayer substrate provide for electrical connection between the multilayer substrate and a higher level assembly, such as a circuit board. The flexible multilayer polyimide substrate is supported by a support structure, which supports a portion of the substrate and leaves a portion of the substrate unsupported to allow the substrate to deflect downwardly.

Circuitry within the multilayer substrate provides interconnection between the electronic devices, and between the electronic devices and the connecting pads on the perimeter of the multilayer substrate. The multiple layers allows for considerably more complex circuitry than can be accomplished with one or two layer methods, such as area TAB. Additionally, the fact that the substrate is flexible and partially unsupported allows the substrate to compensate for differences in height and planarity between multiple devices mounted on the substrate.

The invention is particularly advantageous if used in a so-called "multi-chip package", in which a plurality of semiconductor chips are mounted in the same package. The multiple layers allows for routing of signals between the chips. The flexibility of the multilayer substrate allows for differences in chip height and planarity.

The invention is more completely described in the detailed description of the invention, which will refer to the drawings described below, in which like numerals refer to like elements in the several views.

BRIEF DESCRIPTION OF THE DRAWINGS

FIGS. 8a, 8b, and 8c are cross sectional views of the interconnect of FIGS. 3–7, showing alternative methods of electrically attaching the interconnect to a circuit board.

DETAILED DESCRIPTION OF THE INVENTION

Figure 1:
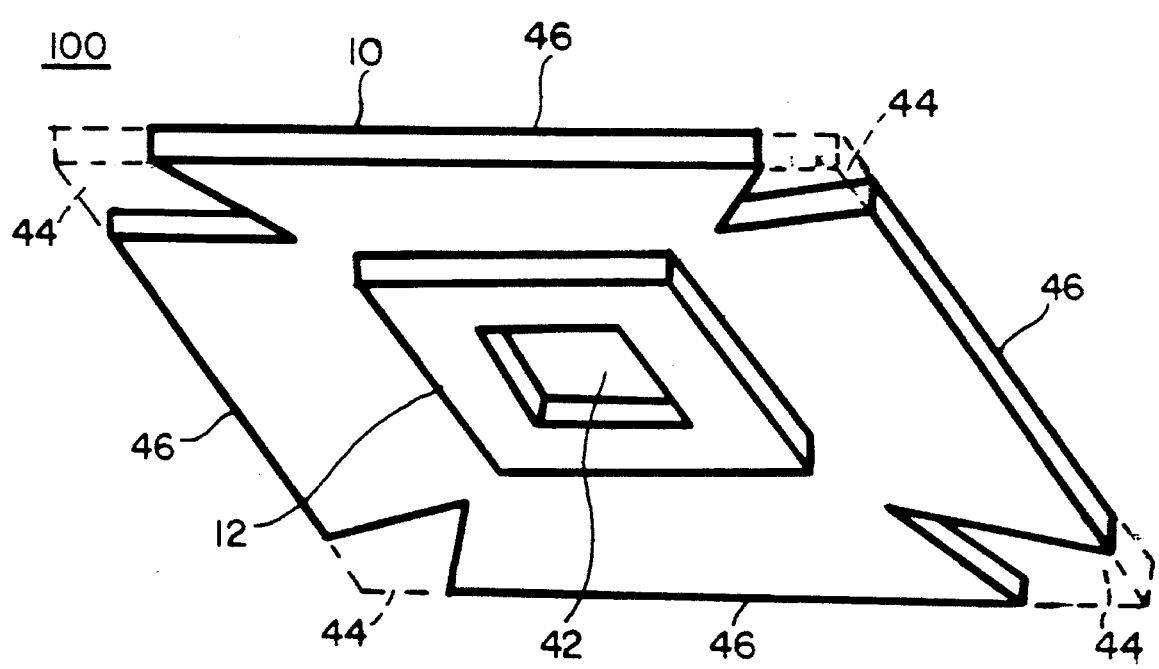
FIG. 1 is bottom perspective view of a multilayer flexible substrate with a support structure.

Referring first to FIG. 1, high density high speed interconnect 100 (hereinafter "interconnect") includes a multilayer flexible substrate 10 supported by a support structure 12. The multilayer flexible substrate may consist of a variety of dielectric materials, such as polyimide. The shape of the multilayer flexible substrate may be of any convenient shape, such as square (as shown in FIG. 1) with corners 44 removed to allow each the four edges 46 of the substrate to deflect downwardly independently of the other three edges, and without wrinkling.

The support structure 12 includes a generally planar section of a rigid material such as molybdenum or aluminum, and has a central section removed to form an opening so that a portion 42 of the multilayer flexible substrate is unsupported. It may be square, with a square opening, or some other convenient shape, such as annular, with a circular opening.

Figure 2:
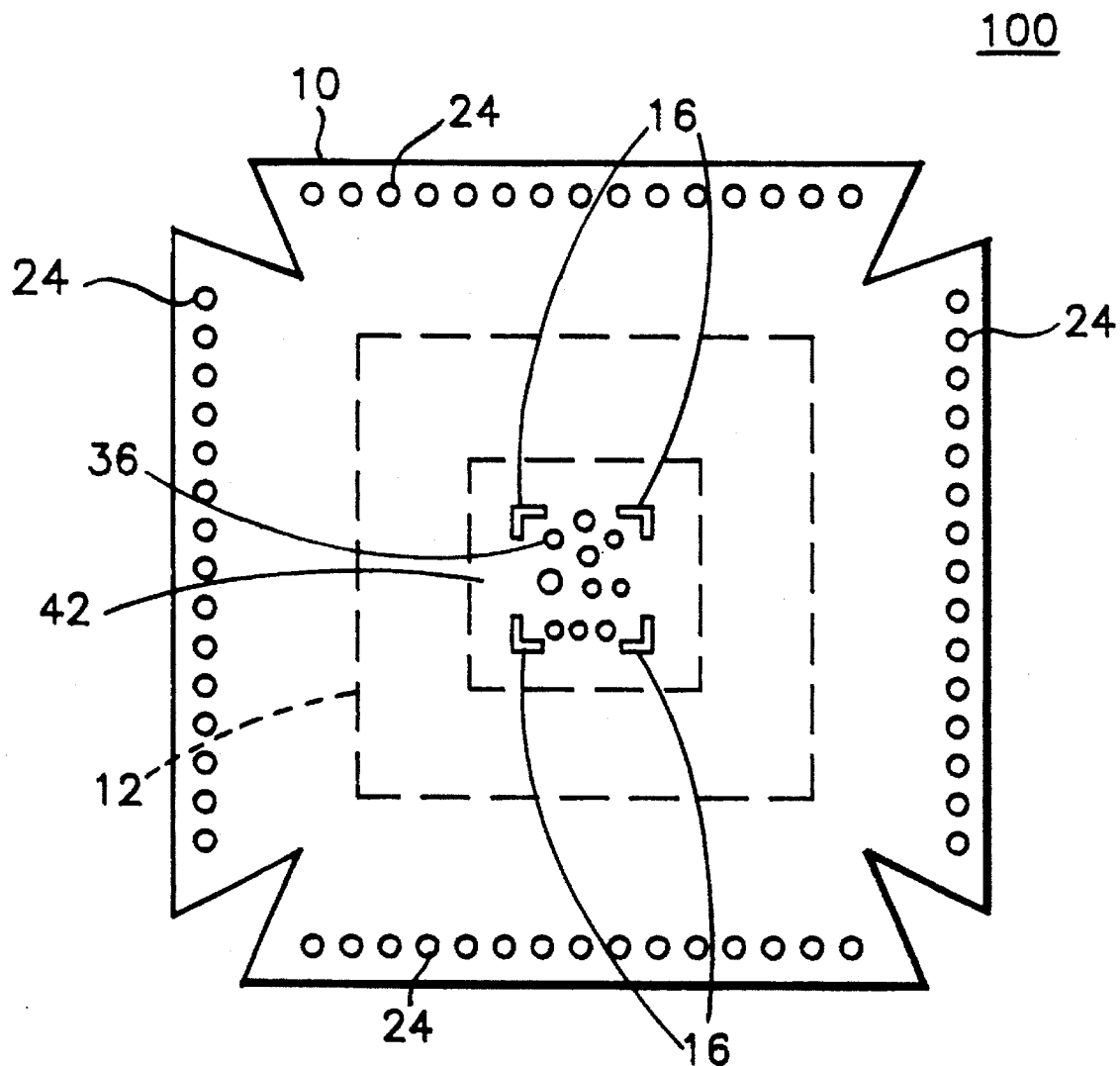
FIG. 2 is a top elevational view of the multilayer flexible substrate and support structure of FIG. 1.

FIG. 2 shows a top elevational view of the multilayer substrate 10 and the support structure 12. Connecting pads 24 provide for electrical connection between the interconnect 100 and a higher level assembly (not shown), such as a circuit board. Connecting pads 24 may also provide for mechanical attachment between the interconnect 100 and a higher level of assembly, but the mechanical attachment may be augmented or provided by a mechanical fastener such as a bolt or clip. The connecting pads may be on the upper surface of the multilayer substrate as shown, or may be on the bottom surface. On the top surface of the multilayer substrate 10, opposite the portion 42 of the multilayer substrate not supported by the support structure 12, are semiconductor connecting pads 36 which provide for electrical connection to a semiconductor chip, not shown. The multiple layers of circuitry in the flexible substrate allow the connecting pads to be easily patterned to accomodate a semiconductor chip having pads on an entire surface of the chip. With conventional one or two layer methods, it is extremely difficult to pattern circuitry to pads placed in the central area of the surface of the chip. Alignment templates 16 may be used to provide a means for aligning the semiconductor chip on the interconnect so that pads on the semiconductor chip align properly with the semiconductor attachment pads. As described in the discussion of FIG. 1, corners 44 of the multilayer substrate may be removed. FIG. 2 illustrates the multilayer substrate in a configuration adapted to accommodate a single semiconductor chip; however those skilled in the art will understand that the multilayer substrate could be adapted to accommodate multiple chips, by adding appropriate semiconductor connecting pads and, if desired, aligning templates.

Figure 3:
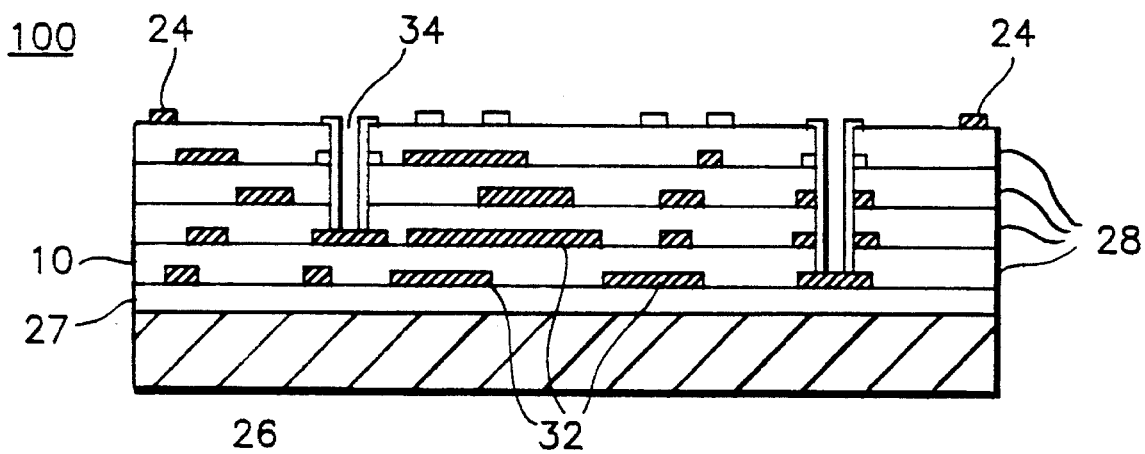
FIGS. 3–7 are cross sectional views of an interconnect shown at various stages of manufacture and use.

FIG. 3 shows the result of a first step in one method for making and using the interconnect. Multilayer substrate 10 may be formed on a rigid planar substrate 26 or may be formed and laminated to a rigid planar baseplate by an adhesive layer 27. One suitable method for forming the multilayer substrate and laminating it to the rigid baseplate is described in U.S. Pat. No. 4,812,191, issued Mar. 14, 1989, to Ho, et al. Baseplate 26 may be molybdenum, as stated in the above referenced U.S. Patent, or another suitable rigid material, such as aluminum. Multilayer substrate 10 includes of a plurality of layers 28 of a flexible dielectric material, such as polyimide, on which circuitry 32 has been placed. Some of the layers 28 may be electrically connected, by plated vias 34, to each other and to connecting pads 36 on the surface of the multilayer substrate 10. Connecting pads 24 and semiconductor connecting pads 36 are then formed. In order to show the layers 28 and the circuitry 36, the thickness of the multilayer substrate is shown as greatly exaggerated compared to the thickness of the multilayer substrate in the other figures.

Figure 4:
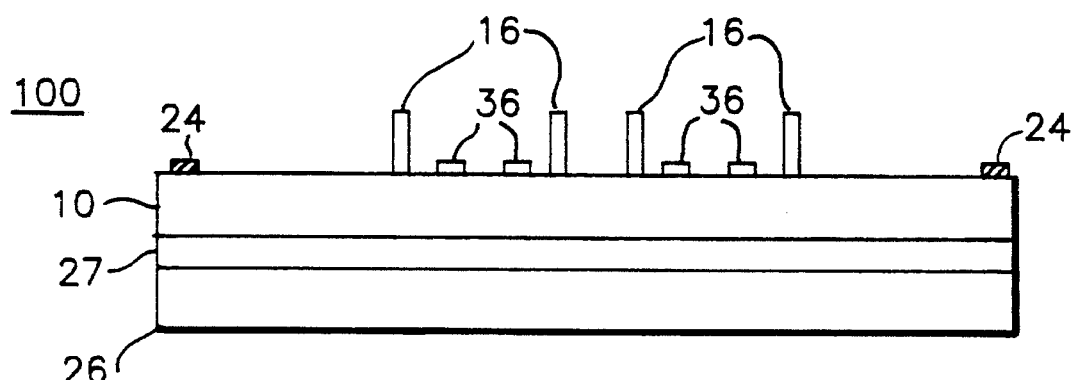

Referring now to FIG. 4, alignment templates 16 may then placed on the multilayer substrate 10 by some convenient method, such as photolithography.

Figure 5:
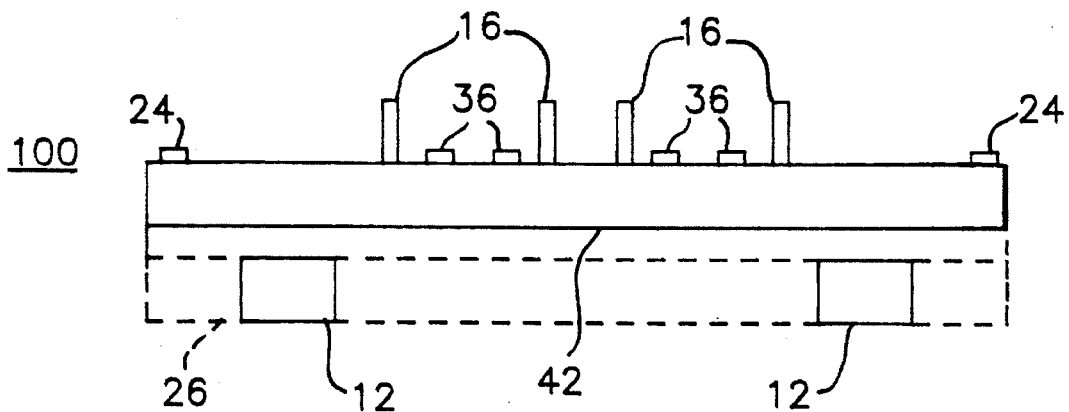

Next, selected portions of the baseplate 26 and the adhesive layer 27 may be removed, such as by selective etching, to leave the support structure 12 and the portion of the adhesive layer 27 between the support structure and the multilayer substrate, and, if desired, corners (44 of FIGS. 1 and 2) may be removed, resulting in the structure shown in FIG. 5. Since the multilayer substrate 10 is flexible, the portion 42 of the multilayer substrate 10 not supported by the support structure 12 can deflect downwardly.

If it is desired for the connecting pads 24 to be on the bottom surface of the multilayer substrate, they can now be formed.

Figure 6:
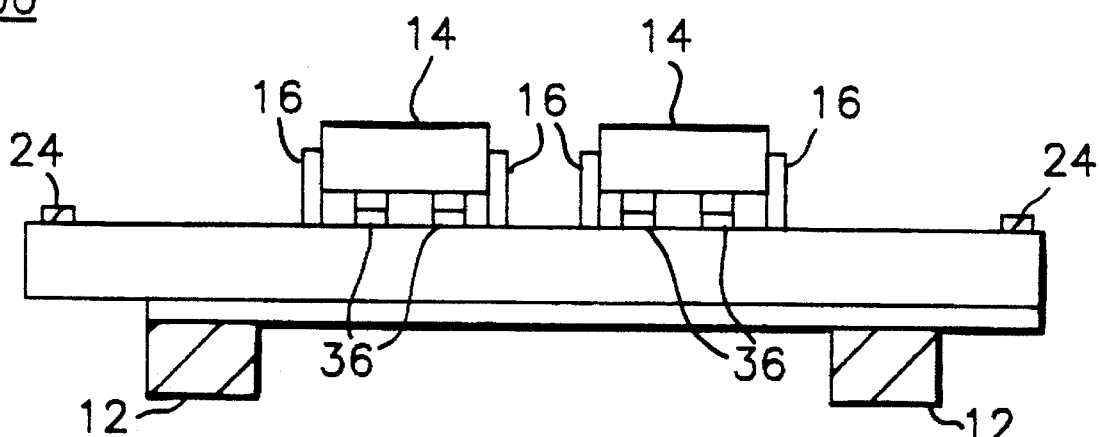

The semiconductor chips 14 are mounted on the multilayer substrate 10 resulting in the structure shown in FIG. 6. Aligning templates 16 align the semiconductor chips 14 so that connecting pads on the semiconductor chips 14 align with corresponding semiconductor connecting pads 36. The structure shown in FIG. 6 is especially suited for so-called "flip chip" mounting.

Figure 7:
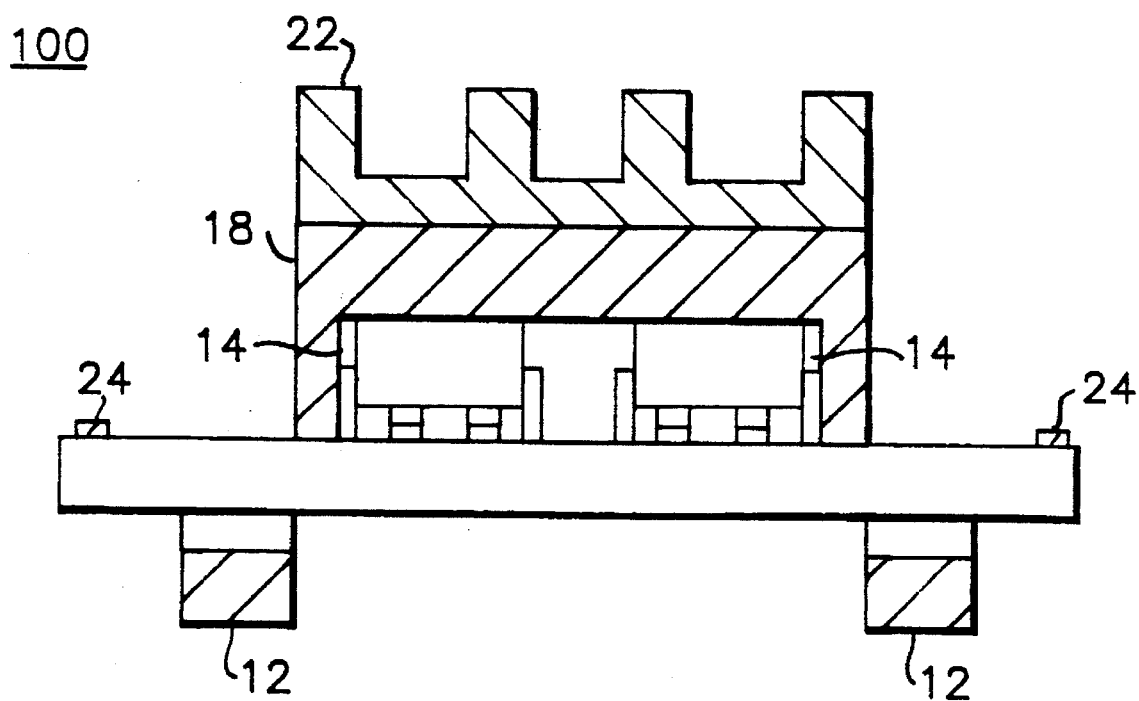

Following the mounting of the semiconductor chips 14, a protective cap 18 and heat sink 22 may be added, resulting in the structure shown in FIG. 7. The lid 18 covers the semiconductor chip 14 and may be mechanically connected to the support structure 12 or to the higher level assembly, such as a circuit board, on which the interconnect is mounted. The lid 18 may also be thermally connected to the semiconductor chips 14, and conduct heat away from the semiconductor chips 14, either directly to the surrounding environment, or to an attached heat sink 22. The lid which is of a thermally conductive material such as aluminum.

Figure 8A:
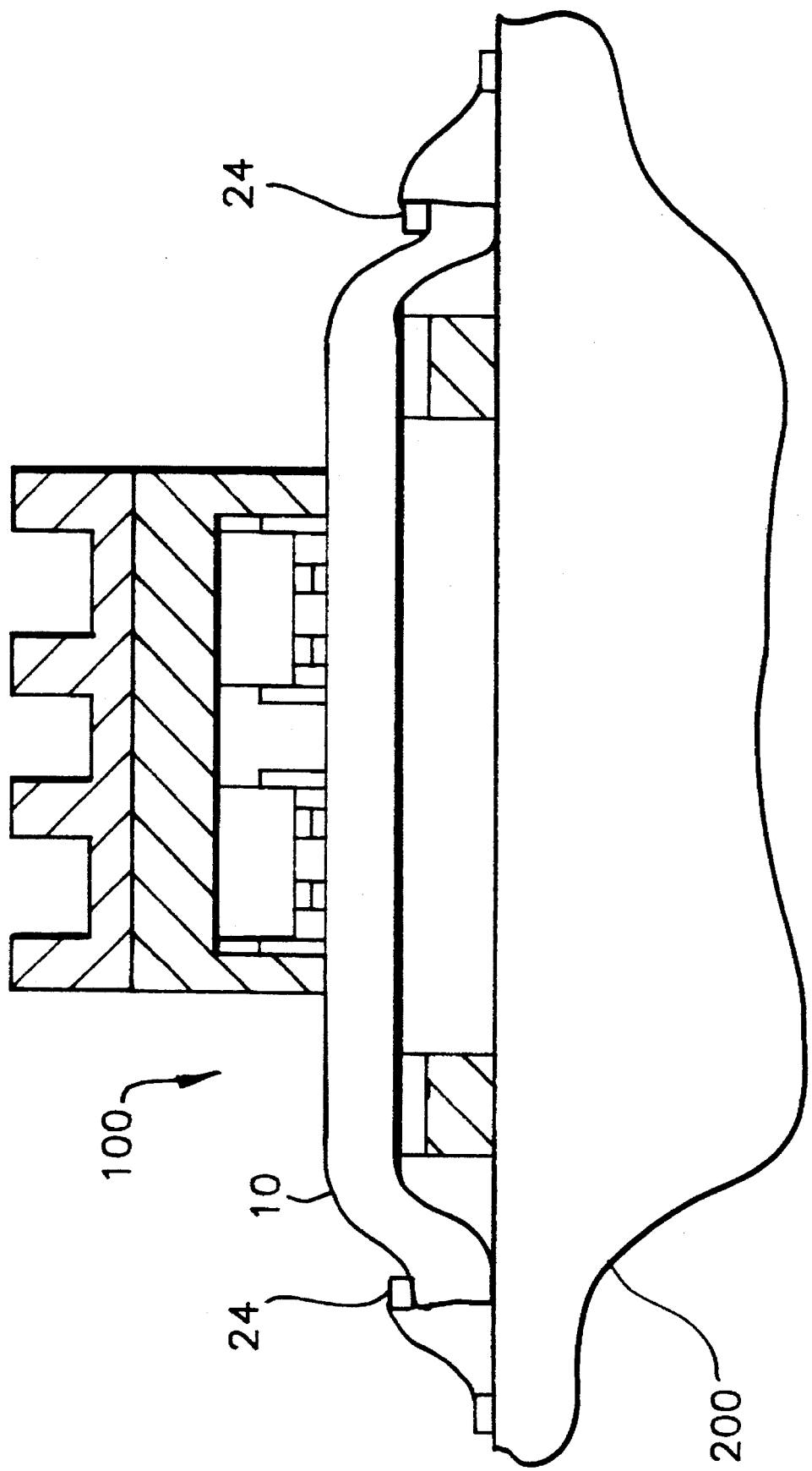
Figure 8B:
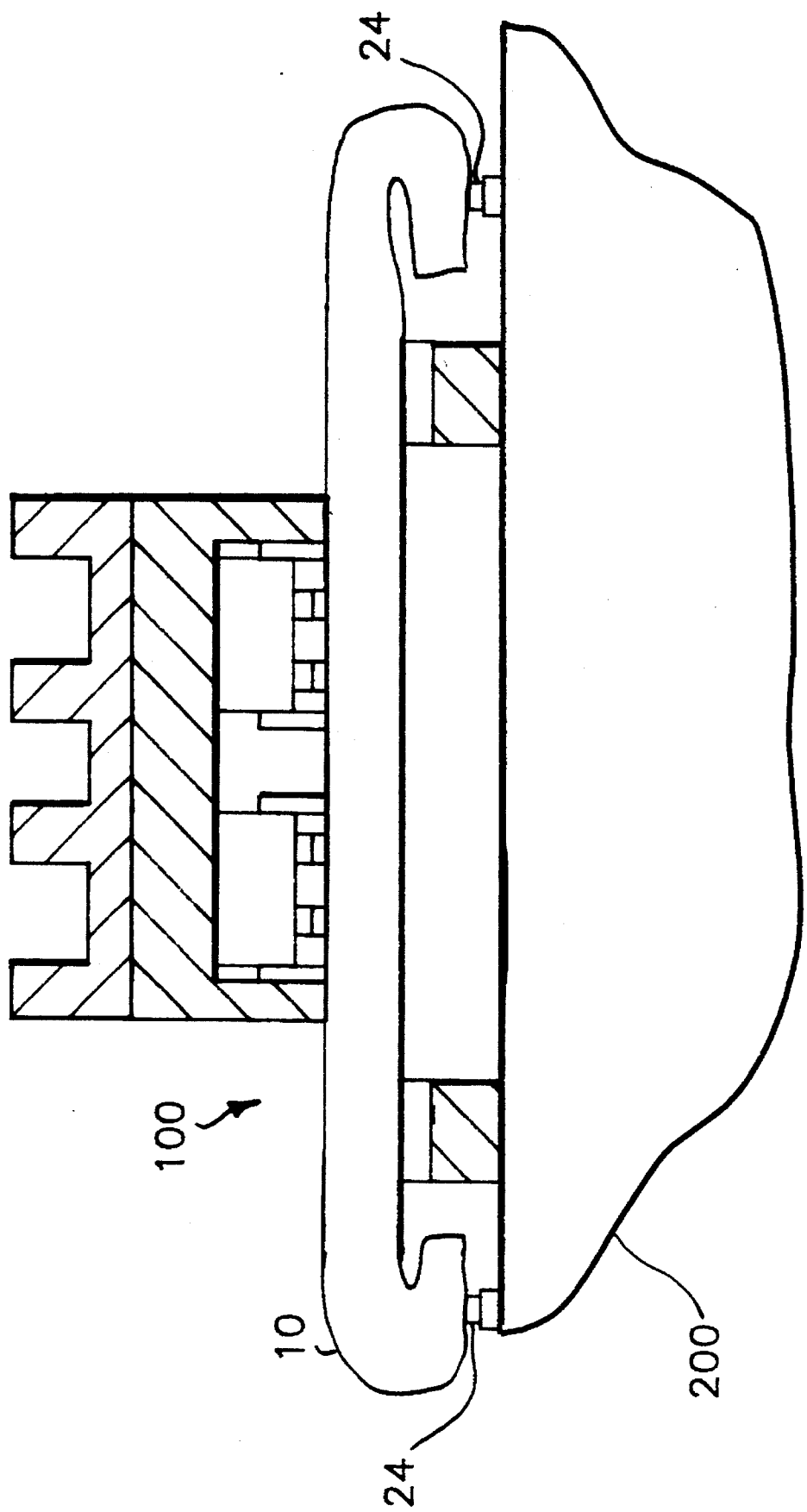

As shown in FIGS. 8a–8c, the interconnect 100 may be electrically connected directly to a circuit board 200 by a number of methods. In FIG. 8a, the interconnect is connected by wire bonding, a method familiar to the art. In FIG. 8b, the multilayer substrate 10 is folded over so that the connecting pads 24 contact corresponding connecting pads on the circuit board, and electrical attachment can be my methods such as soldering or pressure bonding. In FIG. 8c, the connecting pads are on the bottom surface of the multilayer substrate, and electrical connection is accomplished by methods such as soldering or pressure bonding. The method of electrical connection may also serve to mechanically attach the interconnect 100 to the circuit board 200, but mechanical attachment can augmented by a variety of mechanical means, such as clips or bolts.

Although the foregoing has described preferred embodiments of the invention, it will be appreciated by those skilled in the art that changes in these embodiments may be made without departing from the principles of the invention, the scope of which is defined in the appended claims.

We claim:

1. A structure for connecting a semiconductor device to a circuit board comprising:
    a flexible substrate having a plurality of layers, each layer having electronic circuitry separated from circuitry in adjacent layers by a dielectric material;
    a support structure, supporting the flexible substrate, shaped such that a central portion of the flexible substrate is unsupported and leaving a portion of the flexible substrate unsupported permitting said unsupported peripheral portion of the flexible substrate to deflect downwardly;
    a first pattern of connecting pads, in the central portion of the flexible substrate, for connecting to a second pattern of connecting pads on a semiconductor device, including connecting pads in the central area of a surface of the semiconductor device;
    a third pattern of connecting pads at the unsupported peripheral portion of the flexible substrate for connecting directly to a corresponding pattern of connecting pads on a circuit board.

2. The structure as claimed in claim 1, further comprising a template on the flexible substrate for aligning the semiconductor device.

3. The structure as claimed in claim 2, wherein the flexible substrate includes polyimide.

4. The structure as claimed in claim 1, wherein the flexible substrate includes polyimide.

5. The structure as claimed in claim 1, further comprising a lid on the second surface for enclosing the semiconductor device and for removing heat from the semiconductor device.

6. The structure as claimed in claim 5, the pattern of connecting pads including pads for connecting to the central area of a surface of the semiconductor device.

7. The structure as claimed in claim 6, further comprising a template on the second surface for aligning the semiconductor device.

8. The structure as claimed in claim 7, wherein the flexible substrate includes polyimide.

9. The structure as claimed in claim 5, further comprising a template on the second surface for aligning the semiconductor device.

10. The structure as claimed in claim 5, wherein the flexible substrate includes polyimide.

11. The structure as claimed in claim 1, further comprising a semiconductor chip mounted on the flexible substrate, the semiconductor chip having on it a fourth pattern of connecting pads for connecting to the first pattern of connecting pads.

12. The structure as claimed in claim 11, further comprising a lid mounted on the flexible substrate for enclosing the semiconductor device and for removing heat from the semiconductor device.

13. The structure as claimed in claim 12, further comprising a template on the second surface for aligning the semiconductor device.

14. The structure as claimed in claim 13, wherein the flexible substrate includes polyimide.

15. The structure as claimed in claim 11, the fourth pattern of connecting pads including connecting pads in the central area of a surface of the semiconductor device, wherein the first pattern of connecting pads matches the fourth pattern of connecting pads.

16. The structure as claimed in claim 11, further comprising a template on the second surface for aligning the semiconductor device.

17. The structure as claimed in claim 11, wherein the flexible substrate includes polyimide.

* * * * *